United States Patent
Lee et al.

(10) Patent No.: US 8,952,725 B2
(45) Date of Patent: Feb. 10, 2015

(54) LOW VOLTAGE DIFFERENTIAL SIGNAL DRIVING CIRCUIT AND ELECTRONIC DEVICE COMPATIBLE WITH WIRED TRANSMISSION

(71) Applicant: Via Technologies, Inc., New Taipei (TW)

(72) Inventors: Yeong-Sheng Lee, Fremont, CA (US); Kuen-Chir Wang, Fremont, CA (US)

(73) Assignee: Via Technologies, Inc., New Taipei (TW)

( * ) Notice: Subject to any disclaimer, the term of this patent is extended or adjusted under 35 U.S.C. 154(b) by 11 days.

(21) Appl. No.: 13/685,131

(22) Filed: Nov. 26, 2012

(65) Prior Publication Data

US 2013/0076404 A1 Mar. 28, 2013

Related U.S. Application Data

(63) Continuation-in-part of application No. 13/033,648, filed on Feb. 24, 2011, now Pat. No. 8,368,426.

(51) Int. Cl.
*H03K 19/094* (2006.01)
*H03K 17/04* (2006.01)
*H03K 17/00* (2006.01)
*H03K 19/0185* (2006.01)
*H04L 25/02* (2006.01)

(52) U.S. Cl.
CPC ............. *H03K 17/04* (2013.01); *H03K 17/002* (2013.01); *H03K 19/018528* (2013.01); *H04L 25/0272* (2013.01); *H04L 25/0278* (2013.01)
USPC .................... 326/86; 326/30; 326/34; 326/87

(58) Field of Classification Search
None
See application file for complete search history.

(56) References Cited

U.S. PATENT DOCUMENTS

| | | | |
|---|---|---|---|
| 6,218,884 B1 | 4/2001 | Chiu | |
| 6,222,388 B1 | 4/2001 | Bridgewater, Jr. | |
| 6,437,599 B1 | 8/2002 | Groen | |
| 6,552,581 B1 | 4/2003 | Gabara | |
| 6,590,432 B1 | 7/2003 | Wu et al. | |
| 6,700,403 B1 | 3/2004 | Dillon | |
| 6,853,220 B2 | 2/2005 | De Laurentiis et al. | |
| 6,977,534 B2 | 12/2005 | Radelinow | |
| 7,183,813 B2 | 2/2007 | Kasanyal et al. | |
| 7,215,156 B1 | 5/2007 | Li | |
| 7,256,626 B2 | 8/2007 | Nguyen et al. | |

(Continued)

*Primary Examiner* — Ahn Tran
(74) *Attorney, Agent, or Firm* — McClure, Qualey & Rodack, LLP

(57) ABSTRACT

A low voltage differential signal driving circuit including positive and negative differential output terminals, an automatic level selector, an output level detector and a transition accelerator. The positive and negative differential output terminals provide a transmission interface with a differential output signal for transmission of a data signal. The automatic level selector outputs a reference voltage corresponding to the transmission interface. The output level detector generates a low-high (or high-low) transition acceleration control signal based on the data signal, the reference voltage, and VTXP signal at the positive differential output terminal (or VTXN signal at the negative differential output terminal). In accordance with the low-high (or high-low) transition acceleration control signal, the transition accelerator couples the positive (or negative) differential output terminal to a high voltage source and couples the negative (or positive) differential output terminal to a low voltage source to accelerate transition of the differential output signal.

23 Claims, 8 Drawing Sheets

(56) References Cited

U.S. PATENT DOCUMENTS

| | | |
|---|---|---|
| 7,579,874 B2 | 8/2009 | Chen et al. |
| 7,595,661 B2 | 9/2009 | Kim |
| 7,800,413 B2 * | 9/2010 | Lee et al. ............... 327/108 |
| 7,825,691 B2 | 11/2010 | Liu |
| 7,863,936 B1 * | 1/2011 | Liu et al. ............... 326/86 |
| 8,493,103 B2 * | 7/2013 | Fukuda et al. ............... 327/112 |
| 2005/0179466 A1 | 8/2005 | Kasanyal et al. |
| 2007/0063739 A1 | 3/2007 | Kim |
| 2008/0048722 A1 | 2/2008 | Suzuki |
| 2008/0246511 A1 | 10/2008 | Miura et al. |
| 2009/0153219 A1 | 6/2009 | Wu et al. |
| 2009/0203333 A1 | 8/2009 | Jeffries et al. |

* cited by examiner

LOW VOLTAGE DIFFERENTIAL SIGNAL DRIVING CIRCUIT AND ELECTRONIC DEVICE COMPATIBLE WITH WIRED TRANSMISSION

CROSS REFERENCE TO RELATED APPLICATIONS

This application is a Continuation-In-Part of pending U.S. patent application Ser. No. 13/033,648, filed Feb. 24, 2011, now U.S. Pat. No. 8,368,426, and entitled "Low Voltage Differential Signal Driving Circuit and Digital Signal Transmitter."

BACKGROUND OF THE INVENTION

1. Field of the Invention

The present invention relates to low voltage differential signal (LVDS) driving circuits and electronic devices compatible therewith.

2. Description of the Related Art

A low operation voltage design is generally used to save power consumption.

However, for high speed transmission interfaces, such as a high-definition multimedia interface (HDMI), serial advanced technology attachment interface (SATA interface), peripheral component interconnect express interface (PCIE interface), universal serial bus interface (USB interface) and so on, the slew rate of the signals of LVDS driving circuits may be slow due to limited operation voltage, and, if so, transmission efficiency of is affected.

BRIEF SUMMARY OF THE INVENTION

Low voltage differential signal (LVDS) driving circuits and electronic devices compatible with wired transmission are disclosed.

A low voltage differential signal driving circuit in accordance with an exemplary embodiment of the invention comprises a positive differential output terminal, a negative differential output terminal, an automatic level selector, an output level detector and a transition accelerator. The positive and negative differential output terminals are coupled to a transmission interface to provide the transmission interface with a differential output signal for transmission of a data signal. The automatic level selector outputs a reference voltage corresponding to the transmission interface. The output level detector generates a low-high transition acceleration control signal based on the data signal, the reference voltage, and a VTXP signal at the positive differential output terminal In accordance with the low-high transition acceleration control signal, the transition accelerator couples the positive differential output terminal to a high voltage source and couples the negative differential output terminal to a low voltage source. In this manner, the low-high transition of the differential output signal is effectively speeded up.

A low voltage differential signal driving circuit in accordance with another exemplary embodiment of the invention comprises a positive differential output terminal, a negative differential output terminal, an automatic level selector, an output level detector and a transition accelerator. The positive and negative differential output terminals are coupled to a transmission interface to provide the transmission interface with a differential output signal for transmission of a data signal. The automatic level selector outputs a reference voltage corresponding to the transmission interface. The output level detector generates a high-low transition acceleration control signal based on an inverted signal of the data signal, the reference voltage, and a VTXN signal at the negative differential output terminal. In accordance with the high-low transition acceleration control signal, the transition accelerator couples the positive differential output terminal to a low voltage source and couples the negative differential output terminal to a high voltage source. In this manner, the high-low transition of the differential output signal is effectively speeded up.

In another exemplary embodiment of the invention, an electronic device compatible with wired transmission is disclosed. The electronic device comprises the aforementioned low voltage differential signal driving circuit and a microprocessor. Due to the microprocessor, a transmission interface coupling to the low voltage differential signal driving circuit is detected. According to the detected result, the microprocessor controls the automatic level selector to generate the reference voltage corresponding to the transmission interface.

In another exemplary embodiment of the invention, a low-voltage differential-signal driving circuit for a transmission interface is disclosed, which comprises a transmitting circuit, a transition accelerator and an output level detector. The transmitting circuit generates a voltage at a positive differential output terminal and a voltage at a negative differential output terminal to provide a differential output signal. The transition accelerator connects the positive differential output terminal to a high voltage source and connects the negative differential output terminal to a low voltage source when the differential output signal transits from low to high, and connects the positive differential output terminal to the low voltage source and connects the negative differential output terminal to the high voltage source when the differential output signal transits from high to low. The output level detector controls the transition accelerator according to a reference voltage corresponding to the transmission interface and the voltage at the positive differential output terminal or the negative differential output terminal A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments which carry out the invention. This description is made for the purpose of illustrating the general principles of the invention and should not be taken in a limiting sense. The scope of the invention is best determined by reference to the appended claims.

Figure 1:
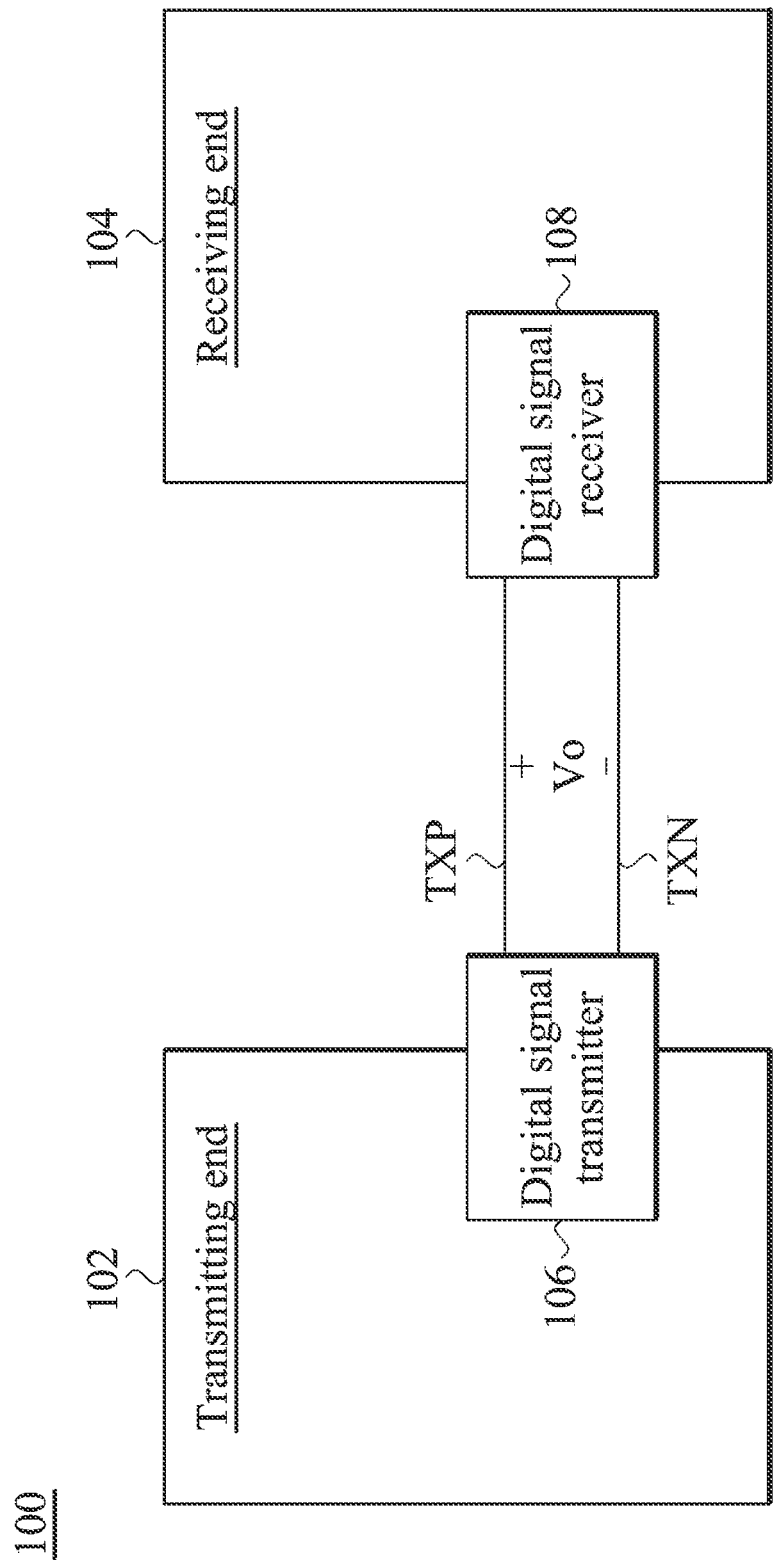
FIG. 1 illustrates an exemplary embodiment of a signal transceiving structure.

FIG. 1 illustrates an exemplary embodiment of a signal transceiving structure. The signal transceiving system 100 comprises a transmitting end 102 and a receiving end 104. The transmitting end 102 comprises a digital signal transmitter 106. The receiving end 104 comprises a digital signal receiver 108. The digital signal transmitter 106 utilizes a positive differential output TXP and a negative differential output TXN to provide a differential output signal Vo for digital signal transmission. The digital signal receiver 108 receives the positive differential output TXP and the negative differential output TXN from the digital signal transmitter 106, and utilizes a comparator to compare the received signals and thereby convert the differential output signal Vo to a digital format.

The signal transceiving system 100 may be realized by various digital signal transmission interfaces, such as an HDMI interface, SATA interface, USB interface, PCIE interface and so on.

To generate and to drive the positive and negative differential outputs TXP and TXN, low voltage differential signal (LVDS) driving circuits are introduced.

Figure 2:
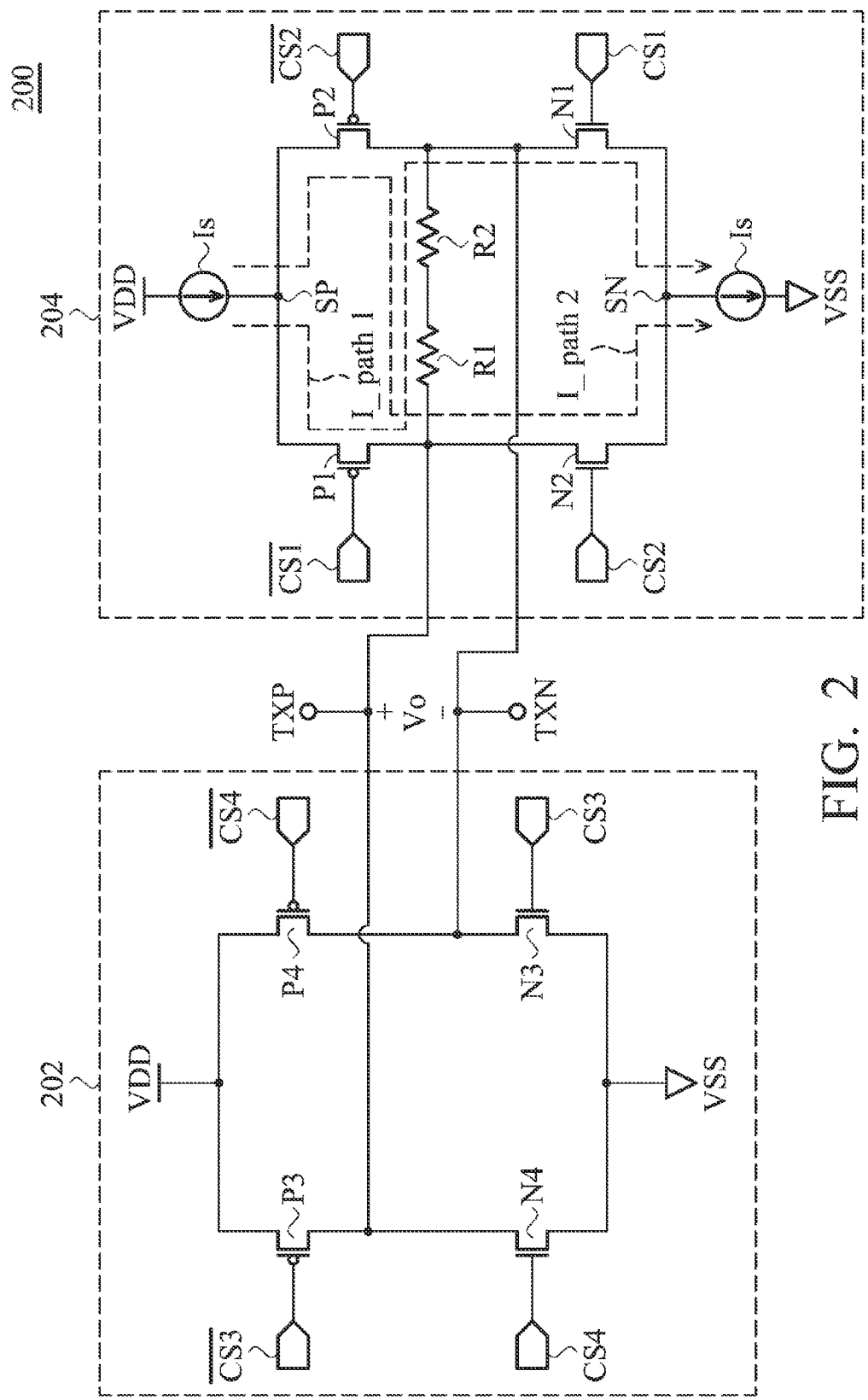
FIG. 2 illustrates an LVDS driving circuit 200 in accordance with an exemplary embodiment of the invention.

FIG. 2 illustrates an LVDS driving circuit 200 in accordance with an exemplary embodiment of the invention. The LVDS driving circuit 200 comprises a positive differential output terminal (labeled as TXP as well) and a negative differential output terminal (labeled as TXN as well), for providing the differential output signal Vo. The LVDS driving circuit 200 further comprises a transition accelerator 202, responding to the transition of the differential output signal Vo for the transition acceleration of the differential output signal Vo. The operations of the transition accelerator 202 are discussed as follows. When the differential output signal Vo transits from low to high, the transition accelerator 202 couples the positive differential output terminal TXP to a high voltage source VDD, and couples the negative differential output terminal TXN to a low voltage source VSS. When the differential output signal Vo transits from high to low, the transition accelerator 202 couples the positive differential output terminal TXP to the low voltage source VSS, and couples the negative differential output terminal TXN to the high voltage source VDD. In this manner, the transition of the differential output signal Vo is maintained at a proper speed without being affected by the design of a low operation voltage.

The following paragraphs describe the details of the LVDS driving circuit 200.

In this embodiment, the circuit 200 comprises a transmitting circuit 204, which in turn comprises an impedance element (formed by the resistors R1 and R2 in this embodiment) and two current path generation circuits (discussed later). The impedance element (formed by R1 and R2) is coupled between the positive differential output terminal TXP and the negative differential output terminal TXN. The two current path generation circuits are enabled alternatively to form a first current path I_path1 and a second current path I_path2, respectively, to allow the currents to flow through the impedance element (formed by R1 and R2) in different directions. In this manner, the transition of the differential output signal Vo provided between the positive differential output terminal TXP and the negative differential output terminal TXN is controlled. The current through the first current path I_path1 and the second current path I_path2 is provided by a first current source coupled to the high voltage source VDD and a second current source coupled to the low voltage source VSS (in FIG. 2, both of the first and second current sources are labeled as Is). The first and second current sources (Is) may be coupled to each other by one of the first and second current paths I_path1 and I_path2. In this embodiment of FIG. 2, the first current source Is coupled to the high voltage source VDD provides a connection node SP while the second current source Is coupled to the low voltage source VSS provides a connection node SN. The connection nodes SP and SN are coupled to each other by the first current path I_path1 or the second current path I_path2.

This paragraph discusses the first current path generation circuit which establishes the first current path I_path1. The first current path generation circuit comprises a first current path control switch and a second current path control switch. In the exemplary embodiment of FIG. 2, the first current path control switch is implemented by a P-channel device P1, and the second current path control switch is implemented by an N-channel device N1. The first current path control switch P1 is coupled between the connection node SP and the positive differential output terminal TXP, and is controlled by an inverted first control signal $\overline{CS1}$ (inverted from a first control signal CS1). The second current path control switch N1 is coupled between the negative differential output terminal TXN and the connection node SN, and is controlled by the first control signal CS1. The first and second current path control switches P1 and N1 are turned on by the high level state of the first control signal CS1, to establish the first current path I_path1 to conduct a current through the impedance element (formed by R1 and R2). In this manner, a positive voltage difference is established between the positive and negative differential output terminals TXP and TXN, and the differential output signal Vo is high.

The second current path generation circuit establishing the second current path I_path2 is discussed in this paragraph. The second current path generation circuit comprises a third current path control switch and a fourth current path control switch. In the exemplary embodiment of FIG. 2, the third current path control switch is implemented by a P-channel device P2, and the fourth current path control switch is implemented by an N-channel device N2. The third current path control switch P2 is coupled between the connection node SP and the negative differential output terminal TXN, and is controlled by an inverted second control signal $\overline{CS2}$ (inverted from a second control signal CS2). The fourth current control switch N2 is coupled between the positive differential output terminal TXP and the connection node SN, and is controlled by the second control signal CS2. The phases of the second control signal CS2 may be (not limited to) opposite to that of the first control signal CS1. The third and the fourth current path control switches P2 and N2 are turned on by the high level state of the second control signal CS2, and thereby the second current path I_path2 is established to conduct a current through the impedance element (formed by R1 and R2). In this manner, there is a negative voltage difference between the positive and negative differential output terminals TXP and TXN such that the differential output signal Vo is low.

In the embodiment of FIG. 2, the differential output signal Vo transits from low to high when the first control signal CS1 is switched to the enable state (high level) and the second control signal CS2 is switched to the disable state (low level), and, the differential output signal Vo transits from high to low when the first control signal CS1 is switched to the disable state and the second control signal CS2 is switched to the enable state.

This paragraph discusses the structure of the transition accelerator 202, which comprises four transition acceleration switches. In this exemplary embodiment, the first transition acceleration switch is implemented by a P-channel device P3, the second transition acceleration switch is implemented by an N-channel device N3, the third transition acceleration switch is implemented by a P-channel device P4, and the fourth transition acceleration switch is implemented by an N-channel device N4. As shown, the first transition acceleration switch P3 is operative to couple the positive differential output terminal TXP to the high voltage source VDD, and the second transition acceleration switch N3 is operative to couple the negative differential output terminal TXN to the low voltage source VSS. The first and second transition acceleration switches P3 and N3 are controlled by an inverted third control signal $\overline{CS3}$ and a third control signal CS3, respectively, where $\overline{CS3}$ may be inverted from CS3, and CS3 is also named a low-high transition acceleration control signal. Both of the first and second transition acceleration switches P3 and N3 may be turned on when the differential output signal Vo transits from low to high. The third control signal CS3 may be switched to the enable state when the first control signal CS1 is switched to the enable state (i.e. the differential output signal Vo is transiting from low to high). The third transition acceleration switch P4 is operative to couple the negative differential output terminal TXN to the high voltage source VDD, and the fourth transition acceleration switch N4 is operative to couple the positive differential output terminal TXP to the low voltage source VSS. The third and fourth transition acceleration switches P4 and N4 are controlled by an inverted fourth control signal $\overline{CS4}$ and the fourth control signal CS4, respectively. $\overline{CS4}$ may be inverted from CS4, and CS4 is also named a high-low transition acceleration control signal. Both of the third and fourth transition acceleration switches P4 and N4 may be turned on when the differential output signal Vo transits from high to low. The fourth control signal CS4 may be switched to the enable state when the second control signal CS2 is switched to the enable state (i.e. the differential output signal Vo is transiting from high to low).

Note that in the exemplary embodiment of FIG. 2, for head room reduction, the first and third transition acceleration switches P3 and P4 are directly connected with the high voltage source VDD and the second and the fourth transition acceleration switches N3 and N4 are directly connected to the low voltage source. The P-channel device P3 uses a source to directly connect to the high voltage source VDD, a drain to directly connect to the positive differential output terminal TXP, and a gate to receive signal $\overline{CS3}$, an inverted signal of the low-high transition acceleration control signal CS3. Further, the N-channel device N3 uses a source to directly connect to the low voltage source VSS, a drain to directly connect to the negative differential output terminal TXN, and a gate to receive the low-high transition acceleration control signal CS3. The P-channel device P4 uses a source to directly connect to the high voltage source VDD, a drain to directly connect to the negative differential output terminal TXN, and uses a gate to receive the signal $\overline{CS4}$ (an inverted signal of the high-low transition acceleration control signal CS4). The N-channel device N4 uses a source to directly connect to the low voltage source VSS, a drain to directly connect to the positive differential output terminal TXP, and a gate to receive the high-low transition acceleration control signal CS4.

Figure 3:
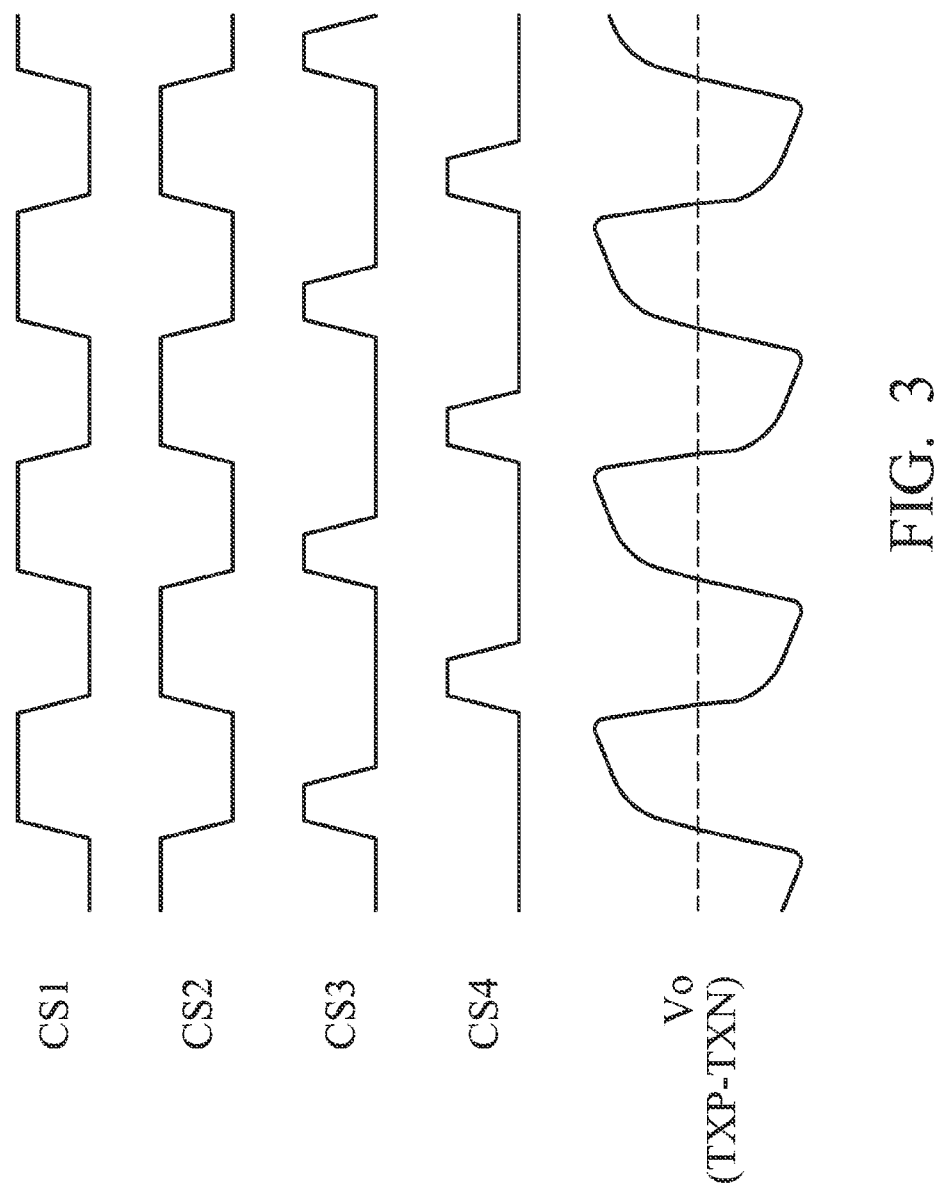
FIG. 3 shows waveforms of the first to the fourth control signals CS1 to CS4 and the differential output signal Vo (i.e. TXP-TXN)

FIG. 3 illustrates waveforms of the first to the fourth control signals CS1 to CS4 and the differential output signal Vo (TXP-TXN). As shown, the transition accelerator 202 (controlled by the third and fourth control signals CS3 and CS4 (as known as the low-high transition acceleration control signal and the high-low transition acceleration control signal, respectively)) accelerates the transition of the differential output signal Vo. Note that in some exemplary embodiments the enabling of the third and the fourth control signals CS3 and CS4 have to be limited to be within a predetermined duration which is determined in accordance with the applied transmission interface, in which different transmission interfaces may have different voltage requirements for the output signal. In this manner, the conduction periods of the first to the fourth transition acceleration switches P3, N3, P4 and N4 are limited to prevent the signal transition from over acceleration, and thereby to meet the specifications of the applied transmission interface.

The transition acceleration design of the disclosure has good performance in a low operation voltage environment. For example, as shown in FIG. 2, the transition accelerator 202 directly acts on the two ends of the impedance element (formed by R1 and R2) such that an RC charging time constant is considerably reduced, such that it is more efficient to accelerate the transition speed of the differential output signal Vo. For at least the reasons stated above, the signal transition speed is not dramatically affected by the low operation voltage environment.

Figure 4:
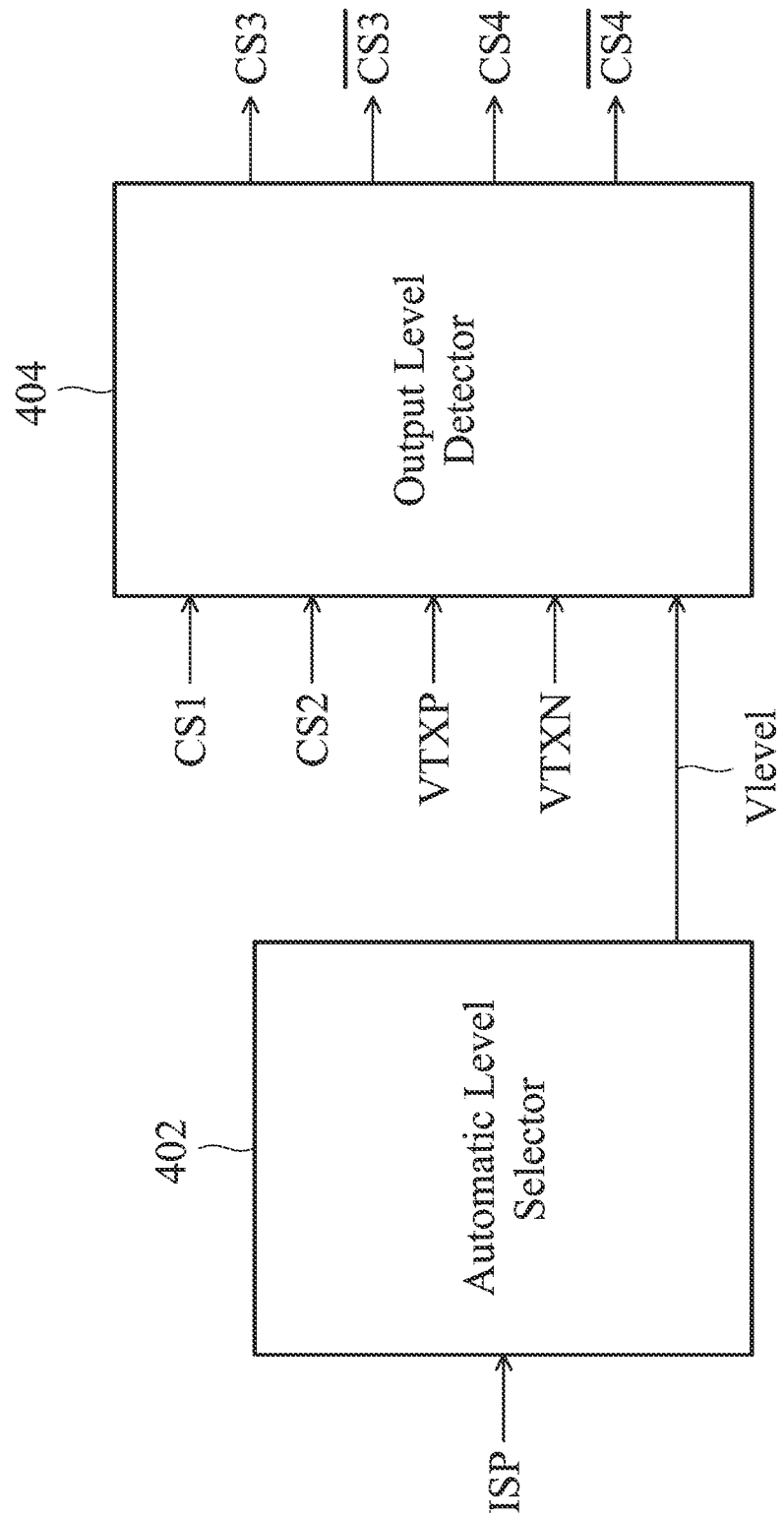
FIG. 4 is a block diagram depicting an automatic level selector 402 and an output level detector 404 in accordance with an exemplary embodiment of the invention.

In another exemplary embodiment of the invention, a low voltage differential signal driving circuit may further comprise an automatic level selector and an output level detector for the generation of the low-high transition acceleration control signal CS3 or/and the high-low transition acceleration control signal CS4. FIG. 4 is a block diagram depicting an automatic level selector 402 and an output level detector 404 in accordance with an exemplary embodiment of the invention. The current-control signal ISP controls a plurality of current sources and depends on the transmission interface driven by the LVDS driving circuit. The automatic level selector 402 outputs a reference voltage Vlevel based on the signal ISP. The reference voltage Vlevel is sent to the output level detector 404 with the control signals CS1 and CS2 (or named first and second data signals, respectively), a VTXP signal at the positive differential output terminal TXP and a VTXN signal at the negative differential output terminal TXN. According to the signals CS1, CS2, VTXP, VTXN and Vlevel, the output level detector 404 generates the low-high transition acceleration control signal CS3 and the high-low transition acceleration control signal CS4 and their inverted signals $\overline{CS3}$ and $\overline{CS4}$.

Figure 5:
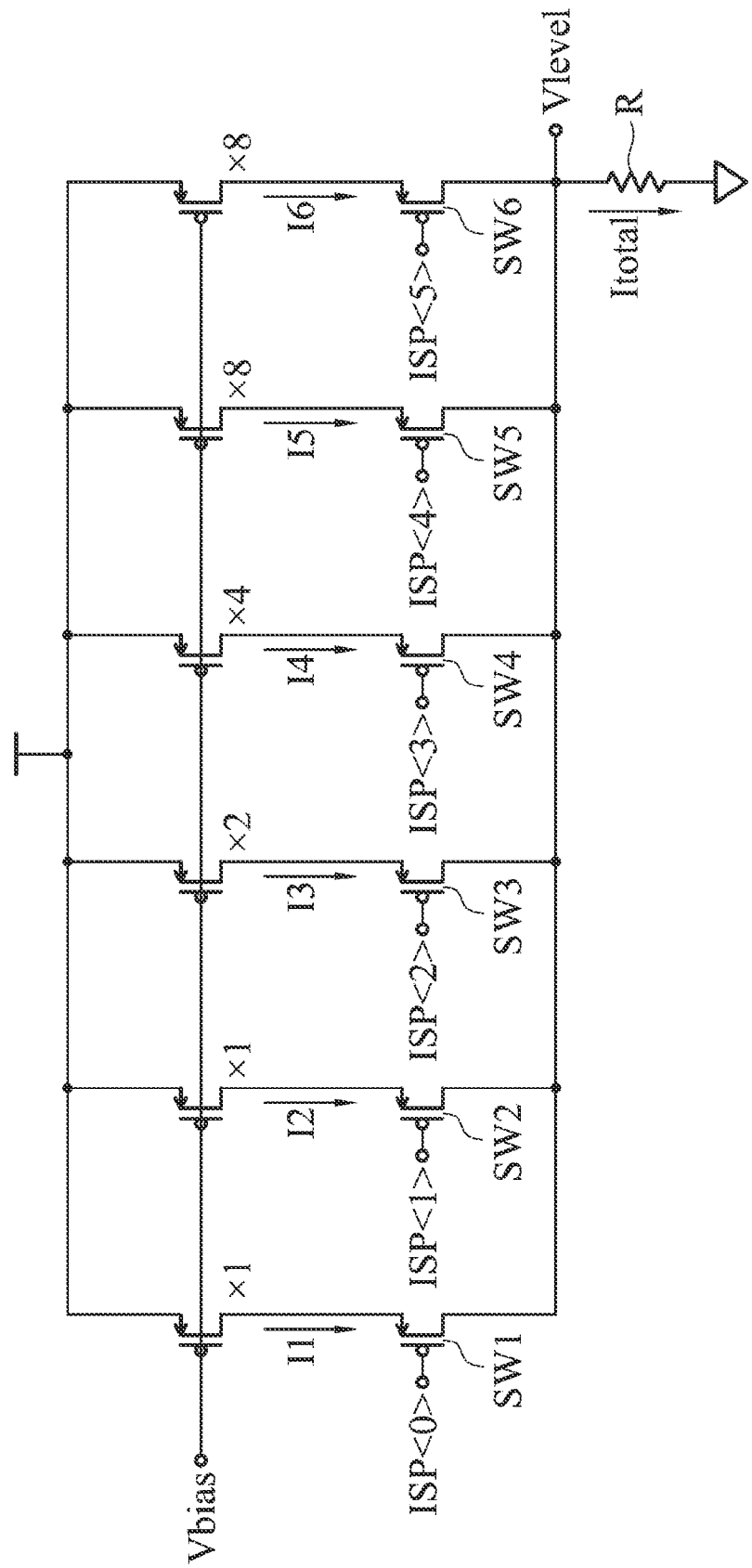
FIG. 5 depicts an automatic level selector 500 in accordance with an exemplary embodiment of the invention.

FIG. 5 depicts an automatic level selector 500 in accordance with an exemplary embodiment of the invention. The automatic level selector 500 comprises a resistance component R, a plurality of current sources (referring to the transistors biased by a bias voltage Vbias and generating currents I1 to I6, respectively) and a plurality of current control switches SW1 to SW6. The plurality of current control switches SW1 to SW6 are connected in series to the plurality of current sources, respectively, and are turned on/off based on their corresponding bits of the signal ISP<0:5> to control the current Itotal flowing through the resistance component R. The aspect ratios (W/L) of each of the plurality of transistors generating currents I1 to I6 are determined such that for each combination of bits of the signal ISP<0:5>, a corresponding current Itotal may be generated. In one embodiment, the first and second current sources Is in the transmitting circuit are also controlled by the signal ISP in a similar way. The signal ISP<0:5> depends on the voltage requirements for the output signal of the transmission interface, and therefore the current Itotal accommodates to different requirements of transmission interfaces. Thus, the reference voltage Vlevel accommodating to different requirements for transmission interfaces may be generated by controlling the current-control signal ISP to set the current Itotal flowing through the resistance component R.

Figure 6:
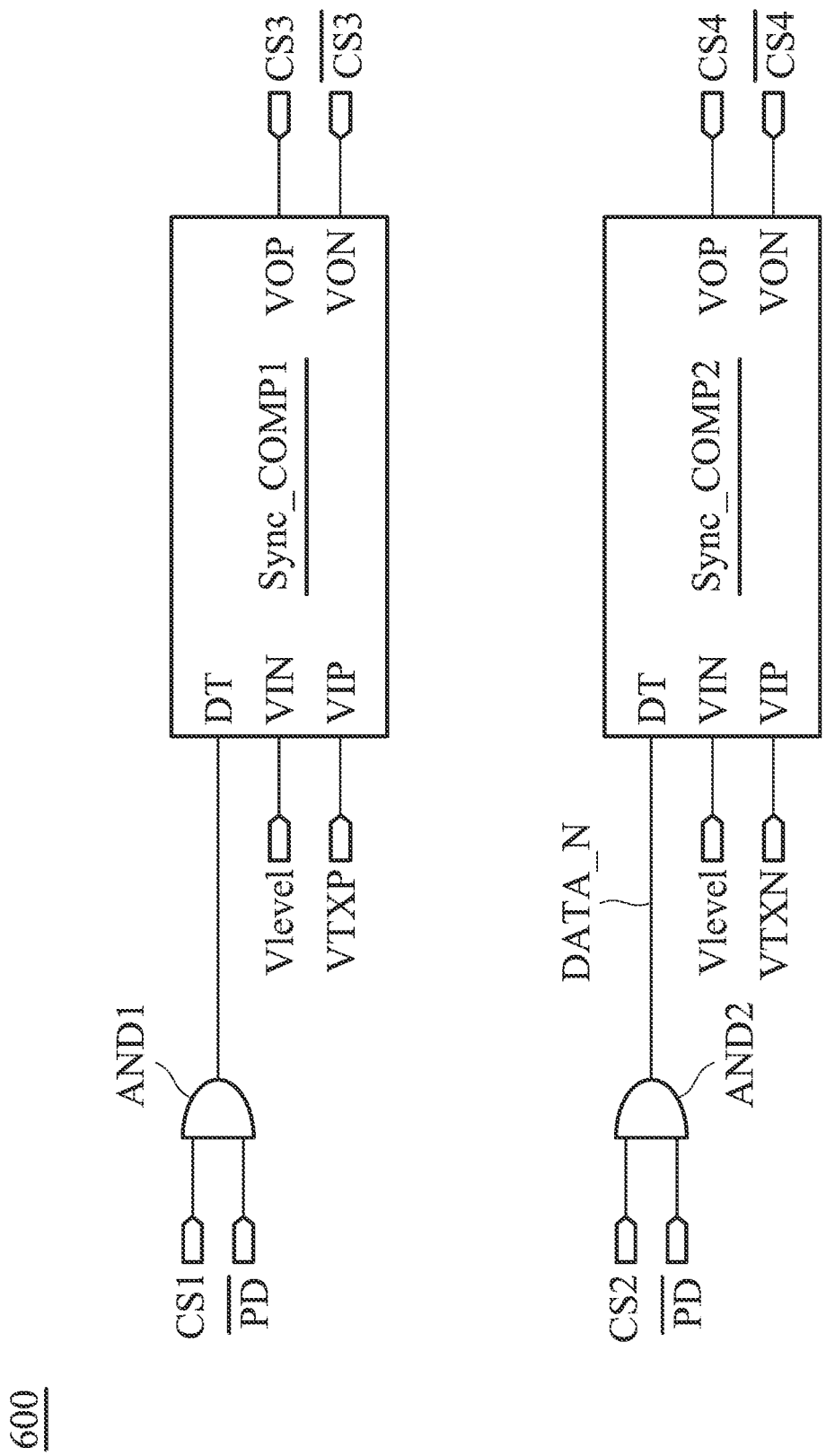
FIG. 6 depicts an output level detector 600 in accordance with an exemplary embodiment of the invention.

FIG. 6 depicts an output level detector 600 in accordance with an exemplary embodiment of the invention. The output level detector 600 comprises two comparators Sync_COMP1 and Sync_COMP2 and two AND gates AND1 and AND2.

The AND gate AND1 receives an inverted power down signal $\overline{PD}$ and the control signal CS1, and has an output terminal coupled to the enable pin DT of the comparator Sync_COMP1. The AND gate AND2 receives the inverted power down signal $\overline{PD}$ and the control signal CS2, and has an output terminal coupled to the enable pin DT of the comparator Sync_COMP2. The power down signal PD under normal conditions is in logic "low"; therefore, the enable pins DT of the comparators Sync_COMP1 and Sync_COMP2 follow the corresponding control signal CS1 or CS2. When the power down signal PD is activated (in logic "high"), the comparators are forced to be disabled. The power down signal PD is activated when the low voltage differential signal driving circuit is in a power-down condition to disable the comparators in order to, for example, save power or turn off the electronic device with the transmission interface.

According to the output signal of the AND gate AND1, the comparator Sync_COMP1 is enabled according to CS1 to compare the VTXP signal with the reference voltage Vlevel. When the comparator Sync_COMP1 is enabled by a high level state of CS1 and the VTXP signal is lower than the reference voltage Vlevel, the comparator Sync_COMP1 keeps the low-high transition acceleration control signal CS3 enabled (e.g. CS3 is high and $\overline{CS3}$ is low). Otherwise, the low-high transition acceleration control signal CS3 is disabled. In this manner, the low-high transition acceleration provided by the first and second transition acceleration switches P3 and N3 of the transition accelerator 202 of FIG. 2 stops when the VTXP signal reaches the reference voltage Vlevel. Because the reference voltage Vlevel depends on the applied transmission interface, the duration of the low-high transition acceleration is properly adapted to the applied transmission interface.

According to the output signal of the AND gate AND2, the comparator Sync_COMP2 is enabled according to CS2 to compare the VTXN signal with the reference voltage Vlevel. When the comparator Sync_COMP2 is enabled by a high level state of CS2 and the VTXN signal is lower than the reference voltage Vlevel, the comparator Sync_COMP2 keeps the high-low transition acceleration control signal CS4 enabled (e.g., CS4 is high and $\overline{CS4}$ is low). Otherwise, the high-low transition acceleration control signal CS4 is disabled. In this manner, the high-low transition acceleration provided by the third and fourth transition acceleration switches P4 and N4 of the transition accelerator 202 of FIG. 2, stops when the VTXN signal reaches the reference voltage Vlevel. Because the reference voltage Vlevel depends on the applied transmission interface, the duration of the high-low transition acceleration is properly adapted to the applied transmission interface.

Note that the AND gates AND 1 and AND2 are optional. In another embodiment, the control signals CS1 and CS2 may be directly connected to the enable pins DT of the comparators Sync_COMP 1 and Sync_COMP2, respectively.

Figure 7:
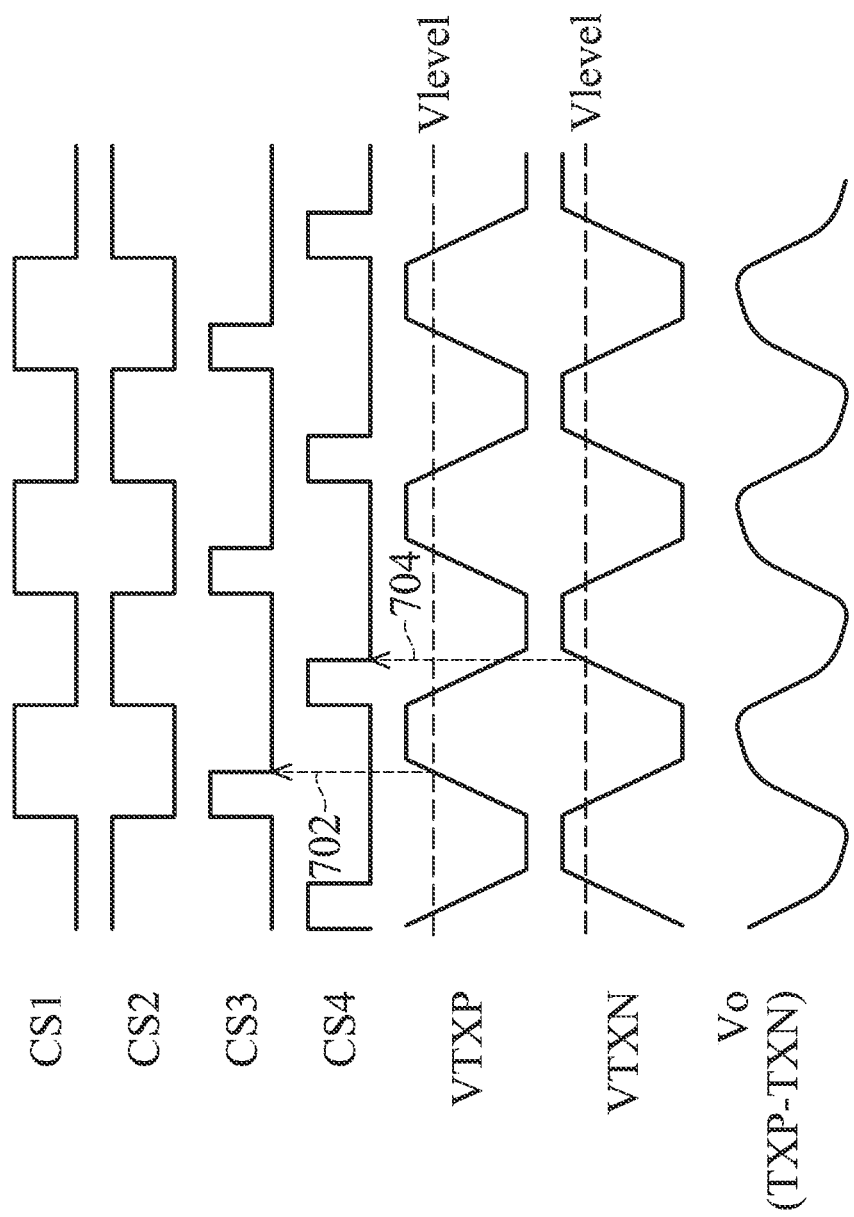
FIG. 7 show waveforms of the controls signals CS1 to CS4, the TXP and TXN signals and the differential output signal Vo (i.e. TXP-TXN) in accordance with an exemplary embodiment of the invention, wherein duration control for the transition acceleration, adapted to the transmission interface, is introduced.

FIG. 7 shows waveforms of the controls signals CS1 to CS4, the VTXP and VTXN signals and the Vo (=TXP-TXN) signal in accordance with an exemplary embodiment of the invention, wherein duration control for the transition acceleration, adapted to the transmission interface, is introduced. The control signals CS1 and CS2 generate a positive/negative difference between the differential output terminals TXP and TXN for transmitting the differential output signal Vo. According to the control signals CS1 and CS2, state transitions at the TXP and TXN terminals occur and CS3 and CS4 are determined As indicated by the arrow 702, the control signal CS3 enabled according to the low-high transition of CS1 is disabled when the VTXP signal reaches the reference voltage Vlevel. According to the disabling of the control signal CS3, the low-high transition acceleration of (TXP-TXN) is timely stopped, and the performance requirements for the applied transmission interface are met. Further, referring to the arrow 704, the control signal CS4 enabled according to the low-high transition of CS2 is disabled when the VTXN signal reaches the reference voltage Vlevel. According to the disabling of the control signal CS4, the high-low transition acceleration of (TXP-TXN) is timely stopped, and the performance requirements for the applied transmission interface are met. In one embodiment, the control signals CS1 and CS2 may be complementary. In another embodiment, the control signals CS1 and CS2 may not be complementary.

Note that the duration control of the transition acceleration may be applied only to the low-high transition acceleration or only in the high-low transition acceleration. In an embodiment, the output level detector may work according to CS1, the VTXP signal and the reference voltage Vlevel without detecting the VTXN signal (e.g., containing the upper components AND1 and Sync_COMP1 of FIG. 6 without the components AND2 and Sync_COMP2 shown in the lower part of FIG. 6), such that only the duration time of the low-high transition acceleration is adapted to the transmission interface. In another embodiment, the output level detector may work according to CS2, the VTXN signal and the reference voltage Vlevel without detecting the VTXP signal (e.g., containing the lower components AND2 and Sync_COMP2 of FIG. 6 without the components AND1 and Sync_COMP 1 shown in the upper part of FIG. 6), such that only the duration time of the high-low transition acceleration is adapted to the transmission interface.

Figure 8:
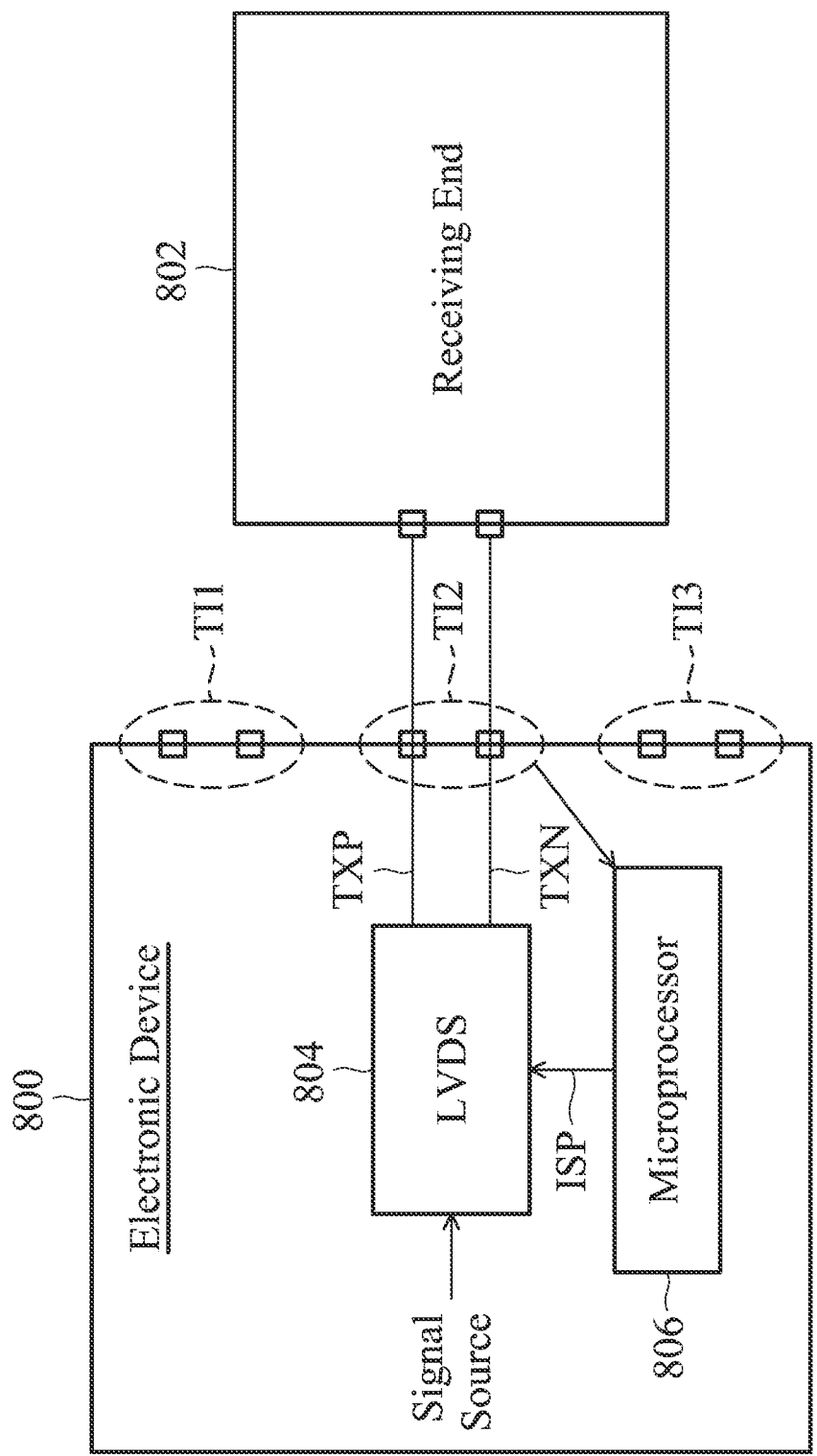
FIG. 8 shows an electronic device 800 in accordance with an exemplary embodiment of the invention.

FIG. 8 shows an electronic device 800 in accordance with an exemplary embodiment of the invention. The electronic device 800 may be compatible with more than one transmission interface (as shown, compatible with three different transmission interfaces TI1, TI2 and TI3). As shown, the second transmission interface TI2 is selected to establish a wired transmission between the electronic device 800 and a receiving end 802. The electronic device 800 may include the low voltage differential signal driving circuit 804 of the disclosure and a microprocessor 806. The positive and negative differential output terminals TXP and TXN of the low voltage differential signal driving circuit 804 are coupled to the transmission interface TI2. When detecting that the transmission interface TI2 is the selected interface, the microprocessor 806 sets the signal ISP (the control signal ISP for the automatic level selector 402 of FIG. 4) to correspond to the transmission interface TI2. In this manner, the duration control of the transmission acceleration of the (TXP-TXN) signal is adapted to the transmission interface TI2.

In another exemplary embodiment, an electronic device including the disclosed low voltage differential signal driving circuit is only compatible with one transmission interface. In this case, the ISP setting corresponding to the transmission interface may be stored in a register by the manufacture.

In summary, a transition accelerator to accelerate the transition of low-voltage differential signals of a transmission interface is disclosed. The transition accelerator directly connects the differential output terminals to voltage sources such that an RC charging time constant is considerably reduced and that the transition speed of the differential output signal is efficiently increased. Thusly, the signal transition speed is not affected by the low operation voltage environment. The transition accelerator may be controlled according to a reference voltage corresponding to the transmission interface and the voltages at the differential output terminals to prevent the signal transition from overshooting.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A low voltage differential signal driving circuit, comprising:
    a positive differential output terminal and a negative differential output terminal, coupled to a transmission interface to provide the transmission interface with a differential output signal according to a first data signal and a second data signal;
    an automatic level selector, outputting a reference voltage corresponding to the transmission interface;
    an output level detector, generating a low-high transition acceleration control signal based on the first data signal, the reference voltage, and a VTXP signal at the positive differential output terminal; and
    a transition accelerator, coupling the positive differential output terminal to a high voltage source and coupling the negative differential output terminal to a low voltage source in accordance with the low-high transition acceleration control signal,
    wherein:
    the output level detector further generates a high-low transition acceleration control signal based on the second data signal, the reference voltage, and a VTXN signal at the negative differential output terminal; and
    the transition accelerator further couples the positive differential output terminal to the low voltage source and couples the negative differential output terminal to the high voltage source in accordance with the high-low transition acceleration control signal.

2. The low voltage differential signal driving circuit as claimed in claim 1, wherein the output level detector comprises:
    a first comparator, enabled according to the first data signal to compare the VTXP signal with the reference voltage, wherein when the first comparator is enabled by a high level state of the first data signal and the VTXP signal is lower than the reference voltage, the first comparator keeps the low-high transition acceleration control signal enabled, otherwise, the first comparator disables the low-high transition acceleration control signal.

3. The low voltage differential signal driving circuit as claimed in claim 2, wherein:
    the first comparator is further disabled according to a power down signal.

4. The low voltage differential signal driving circuit as claimed in claim 1, wherein the output level detector further comprises:
    a second comparator, enabled according to the second data signal to compare the VTXN signal with the reference voltage, wherein when the second comparator is enabled by a high level state of the second data signal and the VTXN signal is lower than the reference voltage, the second comparator keeps the high-low transition acceleration control signal enabled, otherwise, the second comparator disables the high-low transition acceleration control signal.

5. The low voltage differential signal driving circuit as claimed in claim 4, wherein:
    the second comparator is further disabled according to a power down signal.

6. The low voltage differential signal driving circuit as claimed in claim 1, wherein the automatic level selector comprises:
    a resistance component; and
    a plurality of current sources and a plurality of current control switches, wherein the plurality of current control switches are connected in series to the plurality of current sources, respectively,
    wherein:
    the current sources provide currents to the resistance component according to statuses of the current control switches, and the reference voltage is generated based on the resistance component and a current value of the resistance component; and
    the current control switches are turned on/off in accordance with the transmission interface.

7. The low voltage differential signal driving circuit as claimed in claim 1, wherein the transition accelerator comprises:
    a first transition acceleration switch, turned on when the low-high transition acceleration control signal is enabled to couple the positive differential output terminal to the high voltage source;
    a second transition acceleration switch, turned on when the low-high transition acceleration control signal is enabled to couple the negative differential output terminal to the low voltage source;
    a third transition acceleration switch, turned on when the high-low transition acceleration control signal is enabled to couple the negative differential output terminal to the high voltage source; and
    a fourth transition acceleration switch, turned on when the high-low transition acceleration control signal is enabled to couple the positive differential output terminal to the low voltage source.

8. An electronic device compatible with wired transmission, comprising:
    the low voltage differential signal driving circuit as claimed in claim 1; and
    a microprocessor, detecting the transmission interface coupling to the positive and negative differential output terminals and thereby providing a detected result to the automatic level selector for generation of the reference voltage.

9. A low-voltage differential-signal driving circuit for a transmission interface, comprising:
    a transmitting circuit, generating a voltage at a positive differential output terminal and a voltage at a negative differential output terminal to provide a differential output signal;

a transition accelerator, connecting the positive differential output terminal to a high voltage source and connecting the negative differential output terminal to a low voltage source when the differential output signal transits from low to high, and connecting the positive differential output terminal to the low voltage source and connecting the negative differential output terminal to the high voltage source when the differential output signal transits from high to low;

an output level detector, controlling the transition accelerator according to a reference voltage corresponding to the transmission interface and the voltage at the positive differential output terminal or the negative differential output terminal; and an automatic level selector, generating the reference voltage according to a current-control signal.

10. The low-voltage differential-signal driving circuit as claimed in claim 9, wherein the output level detector comprises:
a first comparator, controlling the positive differential output terminal to connect to the high voltage source and the negative differential output terminal to connect to the low voltage source when the differential output signal transits from low to high and the voltage at the positive differential output terminal is lower than the reference voltage.

11. The low-voltage differential-signal driving circuit as claimed in claim 10, wherein the first comparator is further disabled according to a power down signal.

12. The low-voltage differential-signal driving circuit as claimed in claim 9, wherein the output level detector comprises:
a second comparator, controlling the negative differential output terminal to connect to the high voltage source and the positive differential output terminal to connect to the low voltage source when the differential output signal transits from high to low and the voltage at the negative differential output terminal is lower than the reference voltage.

13. The low-voltage differential-signal driving circuit as claimed in claim 12, wherein the second comparator is further disabled according to a power down signal.

14. The low voltage differential signal driving circuit as claimed in claim 9, wherein the automatic level selector comprises:
a resistance component;
a plurality of current sources; and
a plurality of current control switches,
wherein the plurality of current sources provide currents to the resistance component according to statuses of the plurality of current control switches,
wherein the plurality of current control switches are turned on/off in accordance with the current-control signal,
wherein the reference voltage is generated according to the resistance component and the current-control signal.

15. The low-voltage differential-signal driving circuit as claimed in claim 9, wherein the transmitting circuit comprises a current source generating current according to the current-control signal.

16. The low-voltage differential-signal driving circuit as claimed in claim 9, wherein the transition accelerator comprises:
a first transition acceleration switch, turned on when the differential output signal transits from low to high to connect the positive differential output terminal to the high voltage source; and
a second transition acceleration switch, turned on when the differential output signal transits from low to high to connect the negative differential output terminal to the low voltage source.

17. The low-voltage differential-signal driving circuit as claimed in claim 16, wherein the first transition acceleration switch and the second transition acceleration switch are turned on when the voltage at the positive differential output terminal is lower than the reference voltage.

18. The low-voltage differential-signal driving circuit as claimed in claim 9, wherein the transition accelerator comprises:
a third transition acceleration switch, turned on when the differential output signal transits from high to low to connect the negative differential output terminal to the high voltage source; and
a fourth transition acceleration switch, turned on when the differential output signal transits from high to low to connect the positive differential output terminal to the low voltage source.

19. The low-voltage differential-signal driving circuit as claimed in claim 18, wherein the third transition acceleration switch and the forth transition acceleration switch are turned on when the voltage at the negative differential output terminal is lower than the reference voltage.

20. The low-voltage differential-signal driving circuit as claimed in claim 9, wherein the transmitting circuit comprises:
a first current path control switch, coupled between a first current source coupled to the high voltage source and the positive differential output terminal; and
a second current path control switch, coupled between a second current source coupled to the low voltage source and the negative differential output terminal.

21. The low-voltage differential-signal driving circuit as claimed in claim 20, wherein the first current source and the second current source generate current according to a current-control signal, wherein the reference voltage is generated according to the current-control signal.

22. The low-voltage differential-signal driving circuit as claimed in claim 9, wherein the transmitting circuit comprises:
a third current path control switch, coupled between a first current source coupled to the high voltage source and the negative differential output terminal; and
a fourth current path control switch, coupled between a second current source coupled to the low voltage source and the positive differential output terminal.

23. The low-voltage differential-signal driving circuit as claimed in claim 22, wherein the first current source and the second current source generate current according to a current-control signal, wherein the reference voltage is generated according to the current-control signal.

* * * * *